(12) United States Patent
Bond et al.

(10) Patent No.: US 6,984,991 B2
(45) Date of Patent: Jan. 10, 2006

(54) INITIALIZATION OF A BIDIRECTIONAL, SELF-TIMED PARALLEL INTERFACE WITH AUTOMATIC TESTING OF AC DIFFERENTIAL WIRE PAIRS

(75) Inventors: Paul W. Bond, Hurley, NY (US); Daniel F. Casper, Poughkeepsie, NY (US); Edward Chencinski, Poughkeepsie, NY (US); Joseph M. Hoke, Millerton, NY (US); Robert R. Livolsi, Shokan, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/843,092

(22) Filed: May 11, 2004

(65) Prior Publication Data

US 2005/0253593 A1  Nov. 17, 2005

(51) Int. Cl.
 *G01R 31/04* (2006.01)
(52) U.S. Cl. ...................... 324/538; 324/73.1; 324/539
(58) Field of Classification Search ................ 324/539, 324/540, 66, 520, 73.1, 538; 340/658, 650, 340/651, 652
See application file for complete search history.

(56) References Cited

U.S. PATENT DOCUMENTS

| | | | |
|---|---|---|---|
| 5,260,664 A | 11/1993 | Graham | 324/522 |
| 5,268,634 A * | 12/1993 | Batcher | 324/96 |
| 5,347,225 A | 9/1994 | Graham | 324/523 |
| 5,365,515 A | 11/1994 | Graham | 370/17 |
| H1489 H * | 9/1995 | Doan et al. | 702/122 |
| 5,513,377 A | 4/1996 | Capowski et al. | 395/881 |
| 5,522,088 A | 5/1996 | Halma et al. | 396/881 |
| 5,550,533 A | 8/1996 | Pawlowski | 340/825.2 |
| 5,568,526 A | 10/1996 | Ferraiolo et al. | 375/356 |
| 5,598,442 A | 1/1997 | Gregg et al. | 275/354 |
| 5,694,612 A | 12/1997 | Garmire et al. | 395/800 |
| 5,787,094 A | 7/1998 | Cecchi et al. | 371/53 |
| 5,832,047 A | 11/1998 | Ferraiolo et al. | 375/356 |

(Continued)

FOREIGN PATENT DOCUMENTS

JP 7131474 A 5/1995

OTHER PUBLICATIONS

Merriam-Webster Online Thesaurus, www.m-w.com, Copyright 2005 by Merriam-Webster, Incorporated.*

*Primary Examiner*—Anjan Deb
*Assistant Examiner*—John Zhu
(74) *Attorney, Agent, or Firm*—Eugene I. Shkurko, Esq.; Kevin P. Radigan, Esq.; Heslin Rothenberg Farley & Mesiti, P.C.

(57) ABSTRACT

Initialization of a bidirectional, self-timed parallel interface with capacitive coupling is provided. The self-timed interface includes master and slave nodes connected by a parallel bus comprising multiple AC differential wire pairs. The initialization includes automatically testing at least one wire pair of the multiple AC differential wire pairs for conductivity failure, wherein the testing is responsive to a link reset signal of a first frequency. The automatically testing includes employing a link test signal of a second frequency to test the at least one wire pair of the multiple AC differential wire pairs. The second frequency is a lower frequency than a third, operational signal frequency of the self-timed parallel interface, and the first frequency and the second frequency comprise different frequencies. An initialization testing and handshake approach between the master node and slave node is also provided.

28 Claims, 11 Drawing Sheets

U.S. PATENT DOCUMENTS

| | | | |
|---|---|---|---|
| 5,964,866 A | 10/1999 | Durham et al. | 712/200 |
| 5,964,884 A | 10/1999 | Partovi et al. | 713/503 |
| 6,002,247 A * | 12/1999 | Watkins | 324/66 |
| 6,177,801 B1 * | 1/2001 | Chong | 324/520 |
| 6,185,693 B1 | 2/2001 | Garmire et al. | 713/503 |
| 6,219,378 B1 * | 4/2001 | Wu | 375/231 |
| 6,407,569 B1 | 6/2002 | Boettler et al. | 324/763 |
| 6,417,672 B1 * | 7/2002 | Chong | 324/520 |
| 6,442,613 B1 | 8/2002 | Gregg et al. | 709/232 |
| 6,681,254 B1 | 1/2004 | Gregg et al. | 709/232 |
| 6,744,257 B2 * | 6/2004 | Taniguchi et al. | 324/540 |
| 6,845,103 B1 * | 1/2005 | Park | 370/430 |

* cited by examiner

INITIALIZATION OF A BIDIRECTIONAL, SELF-TIMED PARALLEL INTERFACE WITH AUTOMATIC TESTING OF AC DIFFERENTIAL WIRE PAIRS

TECHNICAL FIELD

This invention relates in general to an enhanced approach for initialization of a parallel data bus, and more particularly, to a method, system and computer program product for initializing a bidirectional, self-timed parallel interface employing, in part, automatic testing of AC differential wire pairs of the parallel interface.

BACKGROUND OF THE INVENTION

Multi-channel communications links are important components of various computing platforms, including the S/390 and RS/6000 Power Parallel Systems offered by International Business Machines Corporation. One example of a multi-channel communications link is the Self-Timed Interface (STI) data link offered by International Business Machines Corporation. The STI data link is conventionally a bidirectional parallel data bus comprising multiple DC differential wire pairs. Because of the DC coupling, testing of the wires is relatively straightforward.

In certain enhanced computing platforms, such as the Z/990 eServer System offered by International Business Machines Corporation, the self-timed parallel interface is implemented by multiple AC differential wire pairs. With AC differential wire pairs, the drivers and receivers on opposite ends of the interface are capacitive coupled. Such a system is referred to herein as an Enhanced Self-Timed Interface (ESTI). Because of the capacitive coupling, a receiver may under certain circumstances detect a received signal even when one of the true or complement wires of the corresponding differential wire pair is open circuited or shorted to ground. Without a test to detect open or short circuited wires, the ESTI link may initialize and become operational only to run with an unacceptable bit error rate.

With the migration to ESTI links, therefore, there is a need for testing integrity of the multiple AC differential wire pairs of the enhanced self-timed parallel interface, as well as a need for an initialization approach for the enhanced self-timed parallel interface, and an approach for bringing the parallel interface down when required. The present invention is directed to addressing these needs.

SUMMARY OF THE INVENTION

The shortcomings of the prior art are overcome and additional advantages are provided through a method of initializing a bidirectional, self-timed parallel interface. The self-timed parallel interface includes a first node and a second node connected by a parallel data and clock bus comprising multiple AC differential wire pairs. The method includes: responsive to a link reset signal of a first frequency, automatically testing at least one wire pair of the multiple AC differential wire pairs for conductivity failure; and wherein the automatically testing includes employing a link test signal of a second frequency to test the at least one wire pair of the multiple AC differential wire pairs, the second frequency being a lower frequency than a third frequency, comprising an operational signal frequency of the self-timed parallel interface, and wherein the first frequency and the second frequency also comprise different frequencies.

In an enhanced aspect, the first node functions as a master node for initialization and the second node functions as a slave node. The master node includes first transmit circuitry and first receive circuitry, and the slave node includes second receive circuitry and second transmit circuitry. The first transmit circuitry is connected to the second receive circuitry via a first plurality of AC differential wire pairs of the multiple AC differential wire pairs, and the second transmit circuitry is connected to the first receive circuitry via a second plurality of AC differential wire pairs of the multiple AC differential wire pairs. Within this environment, the method further includes: transmitting the link reset signal of the first frequency from the master node to the slave node, followed by transmitting the link test signal of the second frequency from the master node to the slave node; employing the link test signal of the second frequency at the second receive circuitry of the slave node to test the first plurality of AC differential wire pairs for conductivity failure; upon successful testing of the first plurality of AC differential wire pairs, sending the link test signal of the second frequency from the slave node to the master node; responsive to receipt of the link test signal at the master node, testing the second plurality of AC differential pairs for conductivity failure; and initiating normal operation of the self-timed parallel interface if neither testing at the slave node of the first plurality of AC differential wire pairs nor at the master node of the second plurality of AC differential wire pairs uncovers a conductivity failure, otherwise indicating a wire test failure and stopping initialization of the self-timed parallel interface.

Systems and computer program products corresponding to the above-summarized methods are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
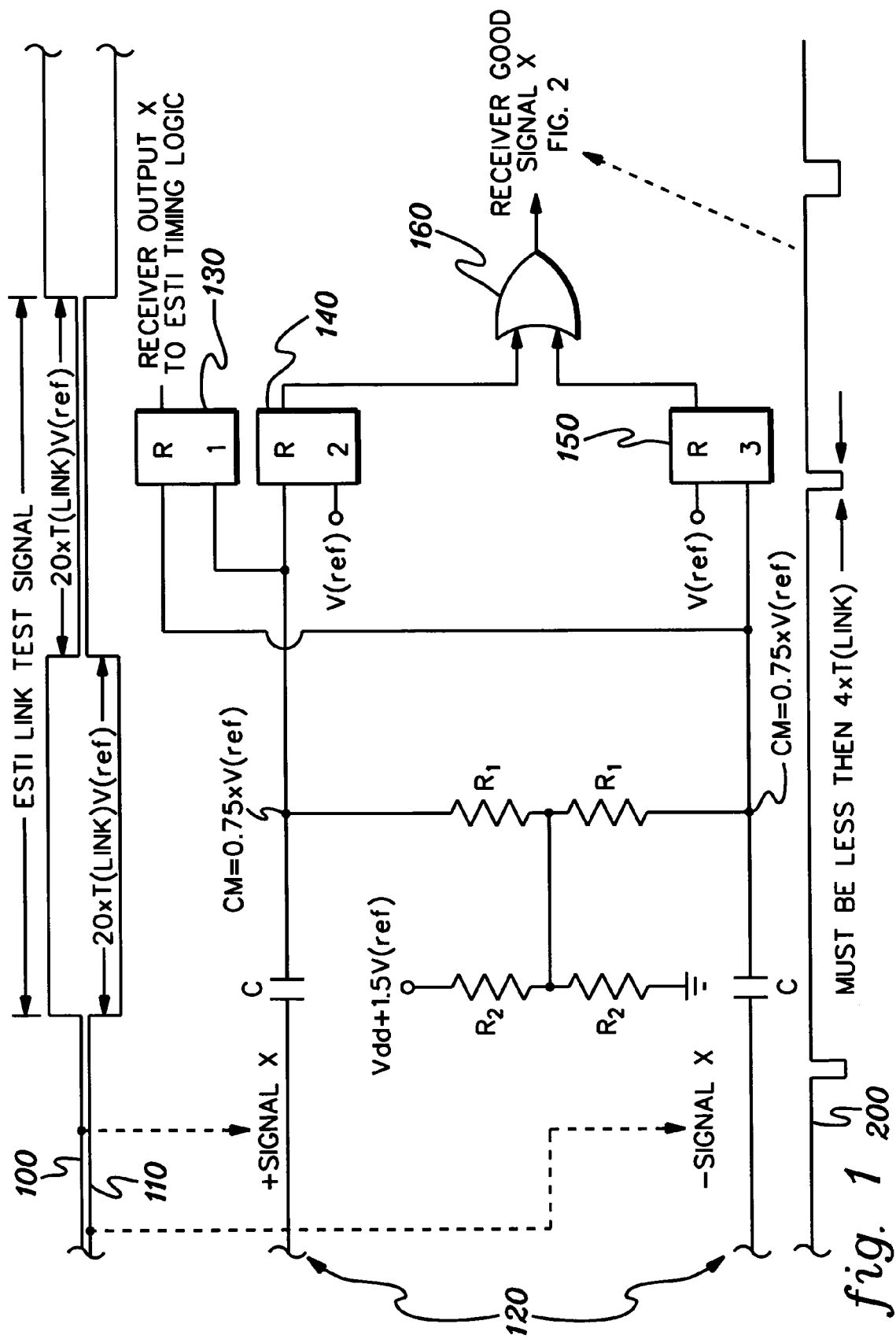
FIG. 1 depicts one example of an AC differential wire pair of a bidirectional (i.e., duplexed), self-timed parallel interface, showing receive circuitry of one node of the parallel interface, in accordance with an aspect of the present invention.

As noted, this invention presents (in one embodiment) an Enhanced Self Timed Interface (ESTI) link initialization process and the circuit elements to implement the process. First, some background on this interface. The ESTI link is a high bandwidth hardware link between asynchronous hardware elements, typically (but not exclusively) within computer systems, connecting to either input/output (I/O) or to other computer systems. The ESTI interface sends 'N' data signals and one link frequency clock signal in each direction between the two elements it is linking (referred to herein as first and second nodes), all transmitted as complementary pairs across multiple AC differential wire pairs. Each side of the link transmits when it is in an operational or PGI (Power Good Indication) state by sending a full frequency link clock over the interface. When this signal is being transmitted, a timing solution is first generated based on the incoming full frequency clock and timing patterns sent over the 'N' pairs of data signals. Once the timing solution is achieved, the link remains operational with the clock at 'PGI frequency' while it transmits useful data at that same frequency over the interface. Other circuits which handle the transmitted data on the chips as it goes to and from the links are clocked at cycle times slower than but a multiple of the link cycle time. Regardless of the link frequency of operation, the other clock frequencies remain fixed multiples of the link frequency.

Throughout this disclosure the link 'PGI clock frequency' is the operational frequency of the link. As an example, F(link) could be chosen to be 1.25 Ghz., with a period T(link)=800 ps. The link frequency can of course be chosen to be any other value that the hardware implementation is capable of handling. The process disclosed herein requires no absolute setting for the frequency. The example embodiment illustrated herein is implemented for an ESTI interface of N=12 data bits and 1 clock bit. Each bit has a respective AC differential wire pair in each direction. Note also that the concepts disclosed herein extend to any width bus. Further, the example embodiment uses a ratio of 5 for F(link)/F(reset signal) and 40 for F(link)/F(test signal) by way of example only. The invention extends to many other ratio choices.

Among other topics, the following areas of the design are addressed in this disclosure:

How ESTI receivers can be implemented to detect 'open circuit' or 'short circuit' link connections.

How PGI (Power Good Indication) can be detected.

ESTI link states for link initialization.

ESTI link error states.

Provision of an ESTI Link Reset Signal.

Provision of an ESTI Link Test Signal.

The F(link) clock.

A Receiver Good Signal.

An All Receivers Good Signal.

In the embodiment disclosed herein, there are eight primary ESTI link states. Certain ones of these states have minor states as well. The states are defined as follows:

LINK FENCED. State 0.0 is the ESTI fenced state. All drivers and receivers except the clock receiver are fenced. Minor states are:

0.0 An ESTI Link Reset Signal has not been received since the link state was set to 0.0.

0.1 An ESTI Link Reset Signal has been received since the link state was set 0.0.

INITIALIZATION FAILED. State 1.0 is entered if the ESTI link failed link initialization. This can happen if one or more of the receivers fails to generate a Receiver Good Signal as explained herein. The interface remains unfenced and the ESTI Link Test Signal continues to be transmitted.

TIMING FAILED. State 2.0 is entered if the ESTI link failed timing mode in state 5.0. The interface remains unfenced and the ESTI Link Test Signal is transmitted.

FAILED WHILE OPERATIONAL. State 3.0 is entered if the ESTI link failed while in the link operational state (state 6.0). The interface remains unfenced and the ESTI Link Test Signal is transmitted.

LINK INITIALIZATION: State 4.0 is entered from state 7.0 when the ESTI Link Test Signal is detected on the clock receiver and all receivers passed the wire test. Minor states are:

4.0 Entered from state 7.2 on a master port.

4.1 Entered from state 7.0 on a slave port or a master port acting as a slave port.

LINK TIMING MODE. State 5.0 is entered from state 4.0 when the F(link) clock is detected. Minor states are:

5.0 PGI ACTIVE.

5.1 PGI is inactive and waiting to see if the ESTI Link Reset Signal will be received.

LINK OPERATIONAL. This state is entered from state 5.0 when the link has been successfully timed and ETs have been exchanged.

6.0 PGI active and link is operational.

6.1 PGI is inactive and waiting to see if the ESTI Link Reset Signal will be received.

LINK INITIALIZATION STARTED. The ESTI link has started link initialization. The minor states are:

7.0 The slave port has received the ESTI Link Test Signal.

7.1 The master port's Enable PGI signal has become active.

7.2 From state 7.1. Master port has received the ESTI Link Reset Signal.

The ESTI link states and transitionings therebetween are discussed further below in connection with the operational flowcharts of FIGS. 7A–9B. Before discussing the initialization and testing process of the bidirectional, self-timed parallel interface, certain components of the receive circuitry and transmit circuitry for the nodes thereof are described below with reference to FIGS. 1–6.

The ESTI receiver at a node of the interface performs two functions. It receives the low voltage differential signal and generates the on chip signal representing the received signal, and it detects if the received signal has connection integrity from the transmitter at link initialization time.

Receiver R1 130 in FIG. 1 receives the input differential signal 100, 110 on an AC differential wire pair 120, and generates an internal received signal for output to ESTI timing logic. AC differential wire pair 120 has a capacitor C in each wire of the pair. Receivers R2 140 and R3 150 are used to determine if there is a valid input differential signal at link initialization. Receivers R2 and R3 receive a +V(ref) reference voltage, which is compared to the received signal with a +0.75•V(ref) common mode voltage level that is derived from the resister network comprising resistors R1 and resistors $R_2$. When there is an input signal 100, 110 as shown, receivers R2 & R3 will have active outputs, each out of phase with the other. The output of the OR gate 160 is a signal similar to signal 200. If both input signals are missing, then the output of OR gate 160 is inactive. If either input signal is missing, then the output of OR gate 160 is a signal that is active half of the time. (If either input signal is not the complement of the other, then the output of OR gate 160 will have a signal that is active less than all of the time. This can happen when cross-coupling results in signal induction from a working connection to its broken partner connection.) If both signals are active and out of phase with each other, then the output of the OR gate 160 is active all the time, except for the transition time. The Receiver Good Signal X out of OR gate 160 is sampled at link initialization time when the 40•T(link) Link Test Signal is transmitted on all N+1 lines of the ESTI link (i.e., on all AC differential wire pairs of the link).

Resistors $R_1$ form the termination network for the incoming transmission line. The resistive divider formed by resistors $R_2$ is used to adjust the common mode voltage feeding receivers R2 & R3. By using these resistors to adjust the common mode voltage properly, control can be provided for how sensitive receiver R2 is to shorted or open wires in the +Signal X path, and how sensitive receiver R3 is to shorted or open wires in the −Signal X path. If the common mode (CM) is too high, then the slightest noise will turn on one or the other receiver and the lack of a good quality test signal caused by problems on the corresponding wire could go unnoticed. If, on the other hand, the common mode is too low, then even a strong signal won't be enough to trip the receiver threshold, and a good quality connection might be indicated as a failing wire.

The Link Test Signal from the clock receiver is detected by determining that a 40•T(ref) signal is being received. A valid signal may be detected at receiver R1, even though one wire of the pair of differential wires may be open between the driver circuit at one node of the interface and the receiver circuit at another node of the interface. Therefore receivers R2 and R3 are used to detect a link that is not correctly transmitting both phases of the differential signal. The reason that the 40•T(ref) test signal is used for this test is that the link test circuit in FIG. 1 will not work at F(link) because the input amplitude at the input of receivers R2 and R3 needs to be {0.75 to 1.0} of V(ref) volts, line to line. At F(link) the input amplitude will not be V(ref) with, e.g., a 10 meter cable length. However during normal operation receiver R1 can detect a differential signal with a voltage as low as 0.1 volt line to line.

Figure 2:
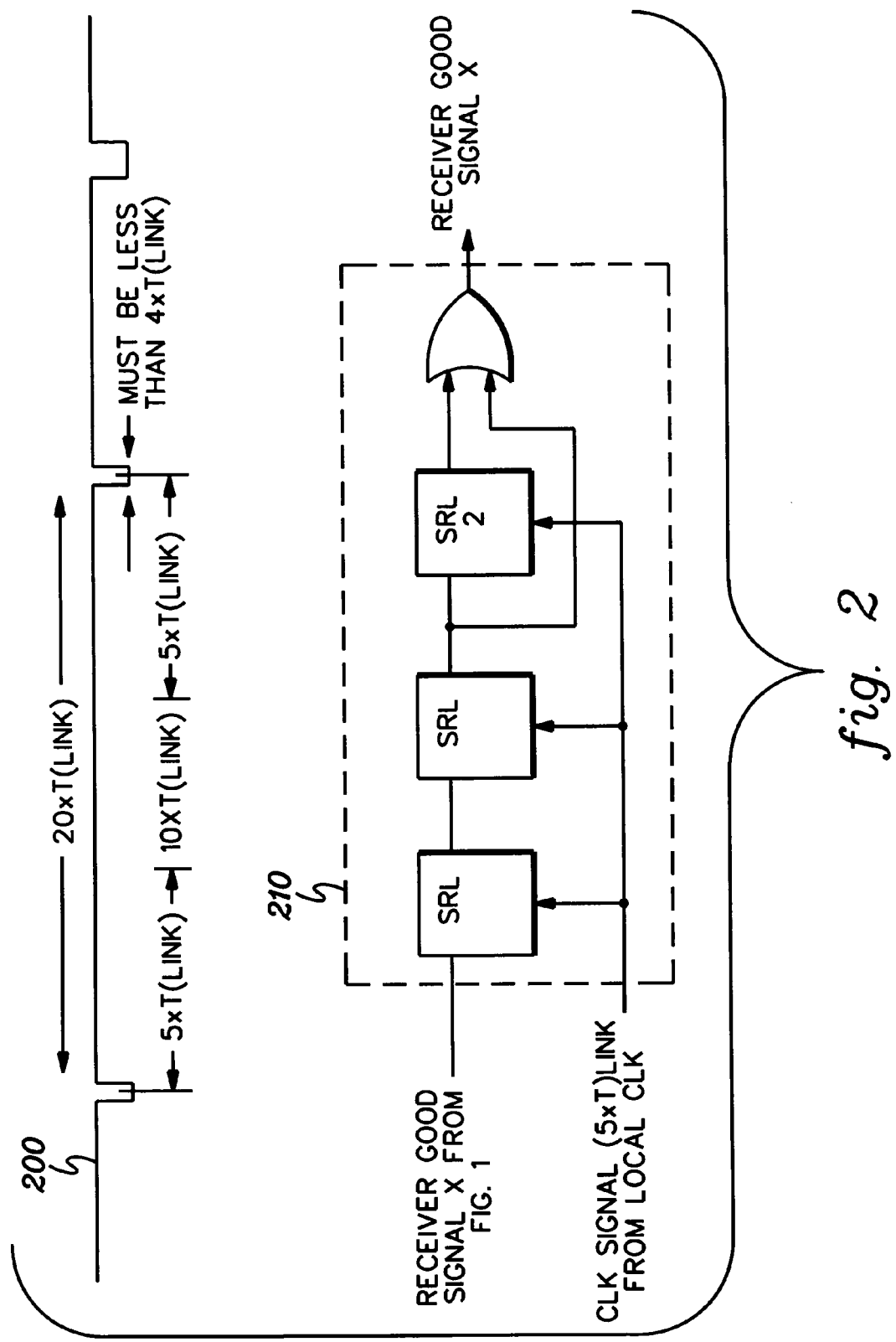
FIG. 2 depicts one example of logic to sample the Receiver Good Signal produced by the receive circuitry of FIG. 1, in accordance with an aspect of the present invention.
Figure 3:
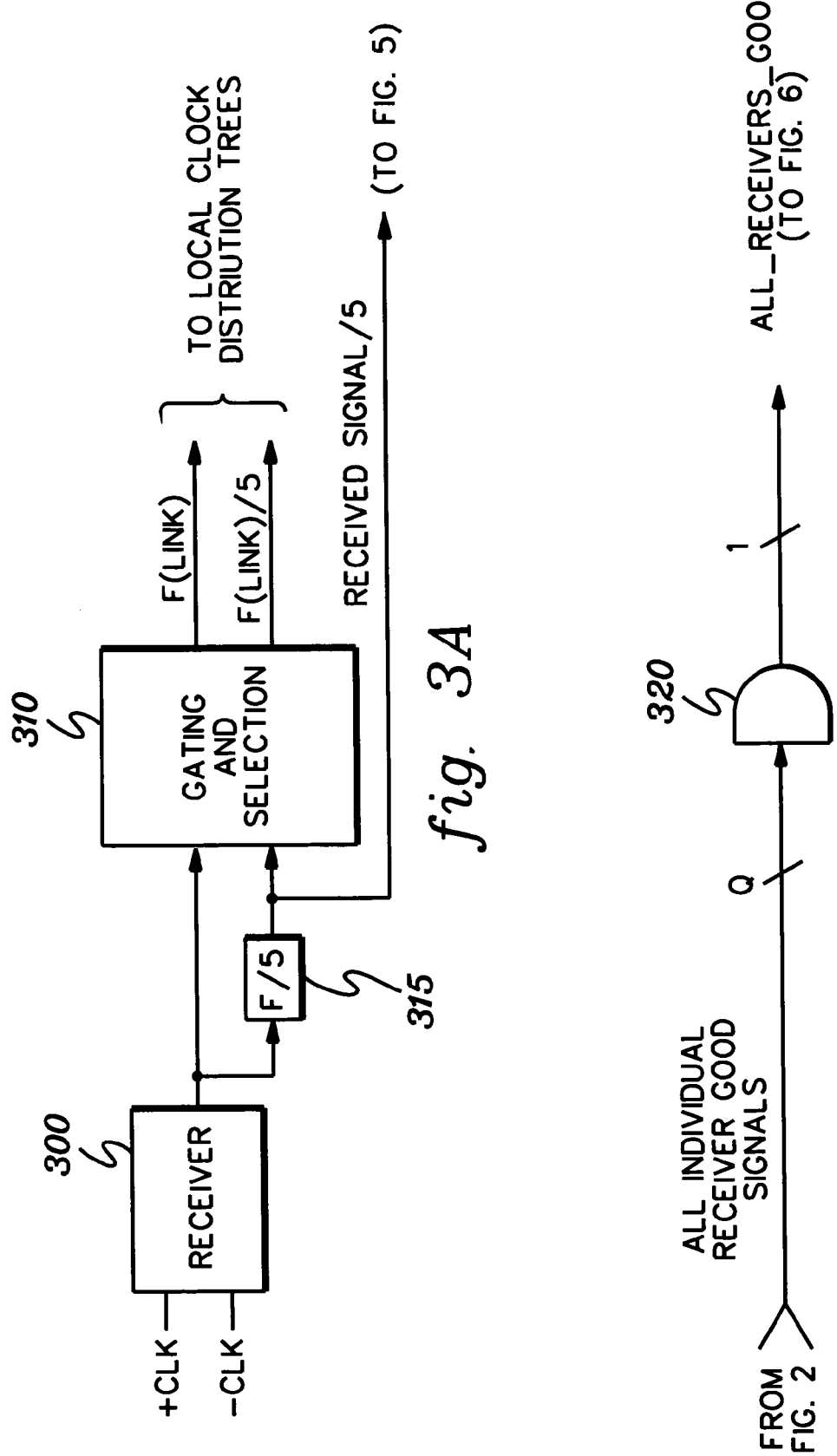
FIG. 3A depicts one example of receive logic for detecting an operational signal frequency of the bidirectional link and a reset signal comprising a fraction of the operational signal frequency of the bidirectional link, in accordance with an aspect of the present invention.
FIG. 3B depicts logic for combining the individual Receiver_Good Signals generated by the multiple receive circuits (FIG. 1) into an All_Receivers_Good signal, in accordance with an aspect of the present invention.

FIG. 2 shows logic 210 which can be used to "de-glitch" the Receiver Good Signal so that it can be sampled during ESTI link initialization. The first two SRLs in logic 210 are used to sync up the signal to the local 5•T(link) clock. SRL 2 is used to remove up to 4•T(Link) pauses that may be present on the Receiver Good Signal during the input signal transitions. The sample signals are generated from the ESTI link initialization logic shown in FIG. 6. The FIG. 2 circuit is used on all (e.g., 13) receivers of a node of the STI link. All Receiver Good Signals are ANDed 320 together after the sync SRLs 210 as shown in FIG. 3B to generate an All_Receivers_Good signal that is tested in FIG. 6.

Note that a trap can be constructed to capture which specific link data or clock bit did not have Receiver_Good active when the link test was run, using the signals on FIG. 2 as a basis.

The receiver circuitry shown in FIG. 1 is represented as receiver 300 in FIG. 3A, which shows the clock receiver. Each receiver has the sync SRLs of FIG. 2 and a Receiver Bad Latch (not shown), which is latched up when the Receiver Good Signal is not active when sampled. The logic shown in FIG. 6 samples the All_Receivers_Good signal at the output of AND 320 (FIG. 3B) of all (e.g., 13) Receiver_Good signals shown in FIG. 3B.

The output of the clock receiver, gated by PGI, is sent to the timing logic 310 in the physical macro to latch up the received data on the (e.g., 12) data lines when the link is in the operational state. The received clock signal is also divided by 5 315 to generate the 5•T(link) clock for the slow speed receive logic. This signal is also sent to the clock detection circuit shown in FIG. 5.

Figure 4:
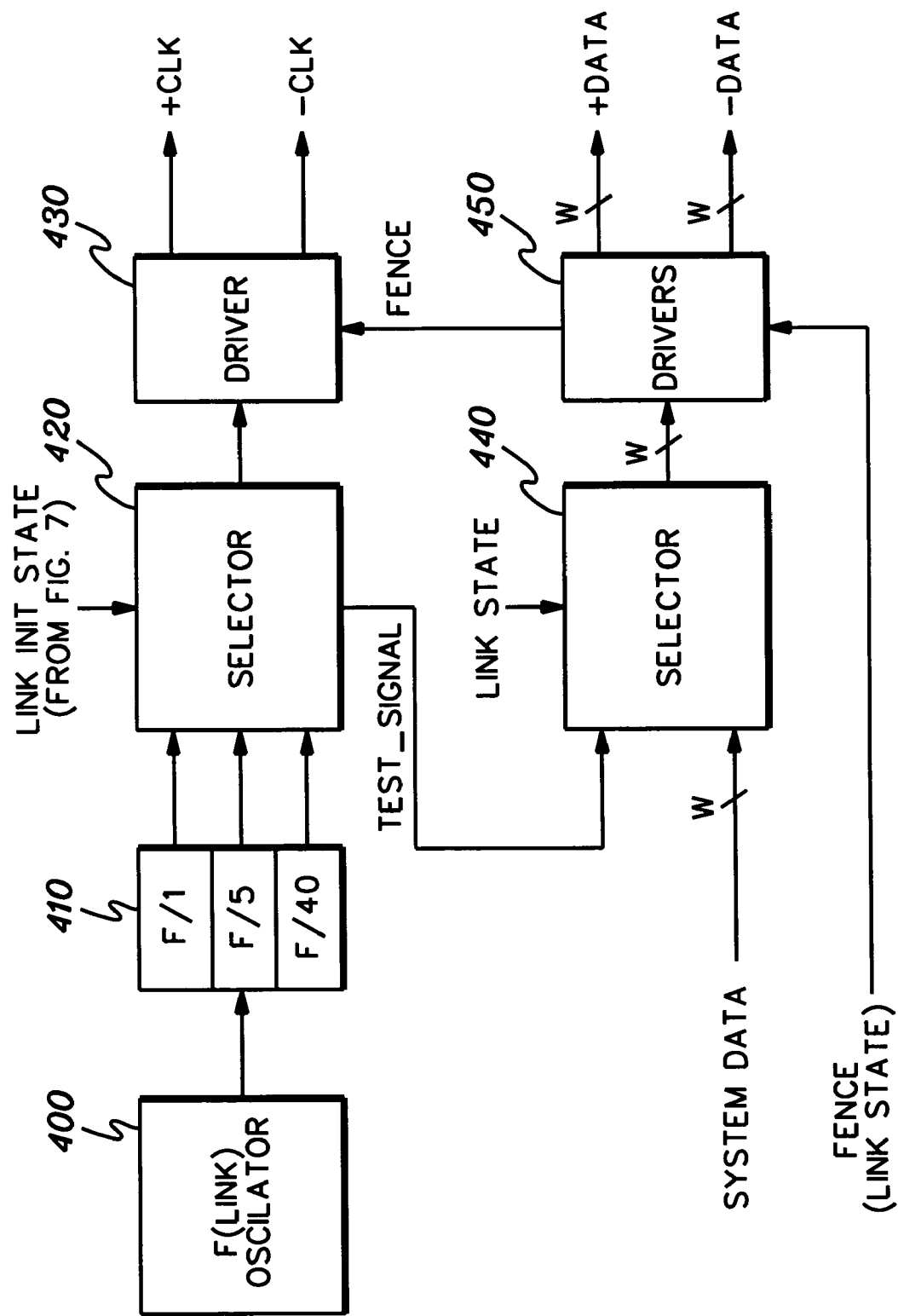
FIG. 4 depicts one embodiment of transmit circuitry for one node of the parallel interface showing clock generation and link drivers, in accordance with an aspect of the present invention.

The 5•(link) clock generated in FIG. 3A is a different clock than the 5•(link) clock shown in FIG. 4, referred to as the 'local' 5•T(link) clock.

FIG. 4 shows a local F(link) phase lock loop 400 and the F(link) signal being divided 410 by 5 to generate the local 5•T(link) clock, and divided by 40 to generate the 40•T(link) ESTI Link Test Signal. The 5•T(link) clock is transmitted via a selector 420 to a clock driver 430 to start the ESTI link initialization by generating an ESTI Link Reset Signal. Next, the ESTI Link Test Signal is transmitted via selectors 420 & 440 on all (13) drivers 430, 450 as part of the ESTI link initialization process discussed herein below. At the start of ESTI link initialization, the driver "fence" gate (link signal) is removed, removing the drivers from their high impedance state. Both the Link Test/Normal Gate and the Driver Fence Gate are generated by the state machine logic shown in FIGS. 7A & 7B.

Figure 5:
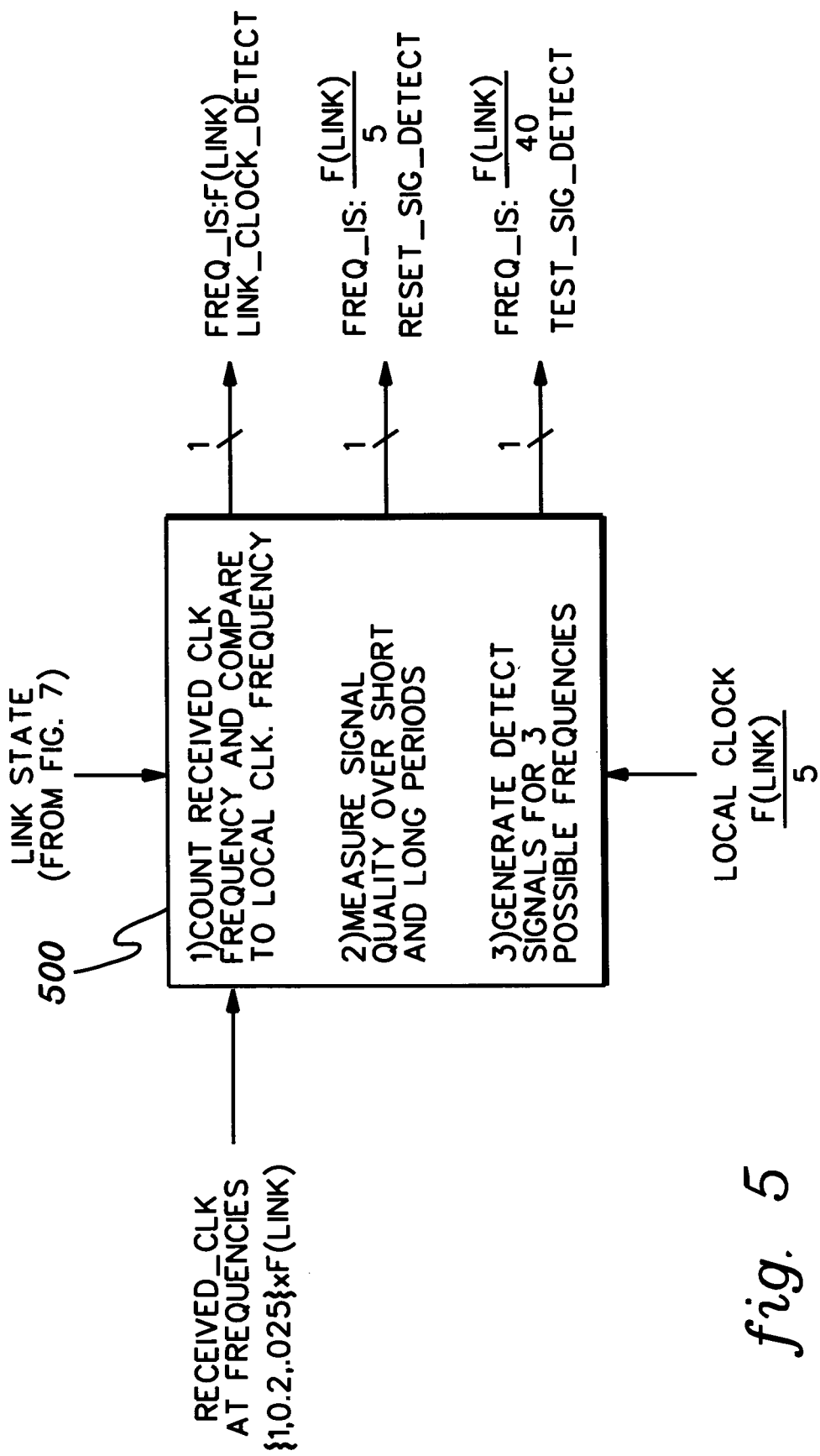
FIG. 5 is a representation of circuitry for detecting presence of an operational signal, a reset signal and a test signal on an AC differential wire pair, in accordance with an aspect of the present invention.

Special care can be taken for deactivation of the T(link) ns clock on the transmit circuitry side of the link FIG. 4, so that the PGI signal generated in FIG. 5 deactivates and degates both the T(link) ns and 5•T(link) clocks in FIG. 3A without glitching clocks. In link state 4.0, the Link Test/Normal Gate is changed from the Link Test to Normal. This may be done without regard to the phase of the T(link) ns clock. Switching from the Normal state to the Link Test state can be done as follows:

1) Activate the Deactivate Clock Line Gate going into selector 420 in FIG. 4. This gate is to block both input clocks from the output.
2) Change the Link Test/Normal Gate from the Normal state to the Test state synchronous to the T(link) ns clock.
3) After a considerable period of 'M' microseconds, remove the Deactivate Clock Line from selector 420 with the Reset/Link Test Gate in the proper state depending on which signal is to be transmitted.

Doing the above will allow for a graceful shutdown of the link. The 'M' microseconds, during which there are no clock transitions on the outgoing clock, allows the receiver circuit side of the link time to deactivate its PGI signal and degate the receiver clocks going to the receive logic as shown in FIG. 3A before either the reset signal or the test signal starts to make transitions.

FIG. 5 depicts circuitry to detect the ESTI Link Reset Signal, the ESTI Link Test Signal and the full frequency F(link) signal (i.e., PGI signal) from the signal received on the clock receiver in FIG. 3A. This detect circuitry can be implemented in several ways, for example: the incoming signal frequency can be divided down and used to capture and reset a free running local clock counter, and then by comparing the captured value of that counter for several samples in a row looking for the count expected from signals of each of the three possible incoming frequencies, within a tolerance range. Furthermore, a short term signal frequency quality measurement can be implemented by a similar algorithm by using a smaller frequency divider to capture variances from the signal frequency quickly once it has already been counted and established valid across a longer time period.

Figure 6:
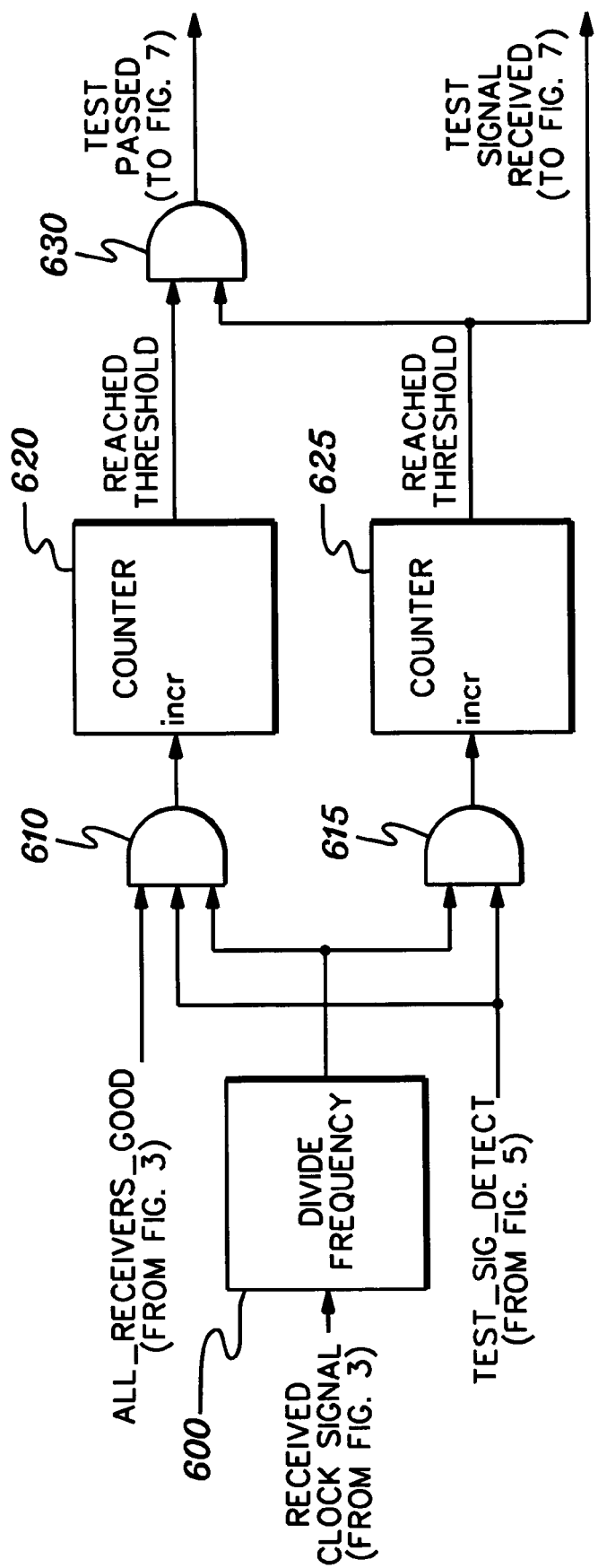
FIG. 6 depicts one embodiment of circuitry for determining whether a test signal has been received for an adequate period of time, and whether testing of the AC differential wire pair has passed, in accordance with an aspect of the present invention.

FIG. 6 shows one circuit approach for a determination of whether the test signal has been received for an adequate period to complete a meaningful wire test, and also whether the wire test has passed. The incoming clock is divided 600 down and ANDed 610 to take periodic samples 620 of the All_Receivers_Good signal, and ANDed 615 with the test signal frequency and counted 625. If enough periods of the test signal frequency are received, then the test is completed. If All_Receiver_Good was ON for each of those samples, then wire test has passed 630.

To start up an ESTI link as described herein, a node of the interface sends two different signals on the ESTI clock line. These signals are:

1) The ESTI Link Reset Signal, which in one example is a F(link)/5 signal transmitted for 'N' microseconds.
2) The ESTI Link Test Signal, which in one example is a F(link)/40 signal transmitted until the ESTI Reset Signal response from the node on the other end of the link is received.

The reasons for two signals are:

1) To help prevent random noise signals received by a receiver that has its corresponding driver fenced, from unfencing the local ESTI link. Having two different signals that have to be received back to back and that have a wide difference in frequency, helps to prevent this. An ESTI link unfenced because of noise will cause extra power dissipation, but the link can still be initialized. For example, if the ESTI Reset Signal is received because the receiver locked on to the local 5•T(link) clock, then the receiver will be in state 0.1, but will still remain fenced. When the real link initialization occurs, the link will initialize. Also, if the reset signal goes away, then the link state will return to 0.0 in a relatively brief period.

2) To help do error isolation. When an ESTI Link fails the All Receivers Good test, the link initialization state machine will hang in state 1.0. However when the ESTI Reset Signal is received again, the ESTI link will again attempt to initialize. Without two different signals there is either a hung state that requires a scan on the slave port or the link has to be designed to keep trying to initialize. With two different signals, if initialization fails, then the results can be gathered and a new attempt initiated under outside control.

Figure 7A:
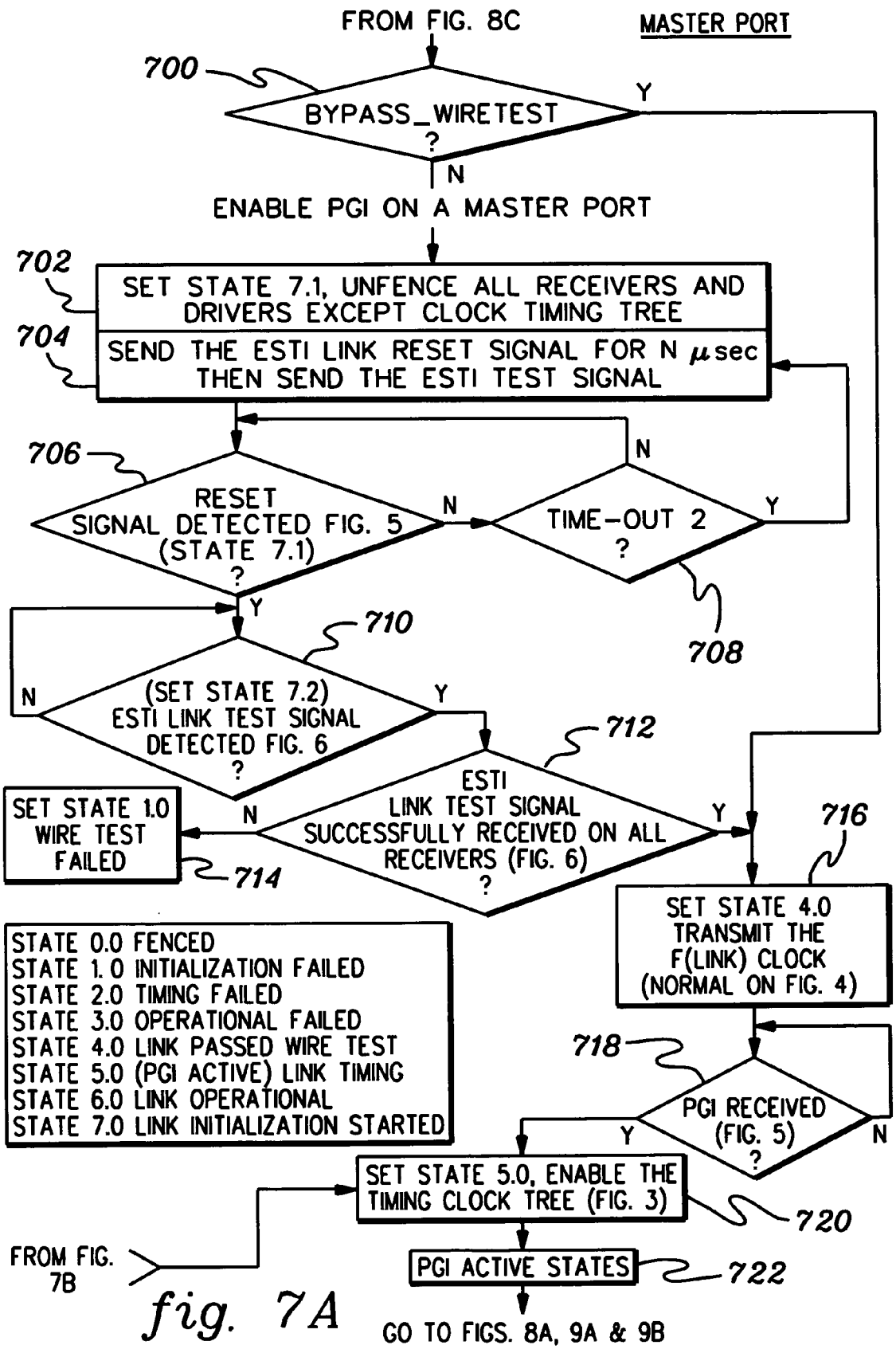
FIGS. 7A & 7B are a flowchart of one embodiment of a method of initializing a bidirectional, self-timed parallel interface comprising multiple AC differential wire pairs, in accordance with an aspect of the present invention.
Figure 7B:
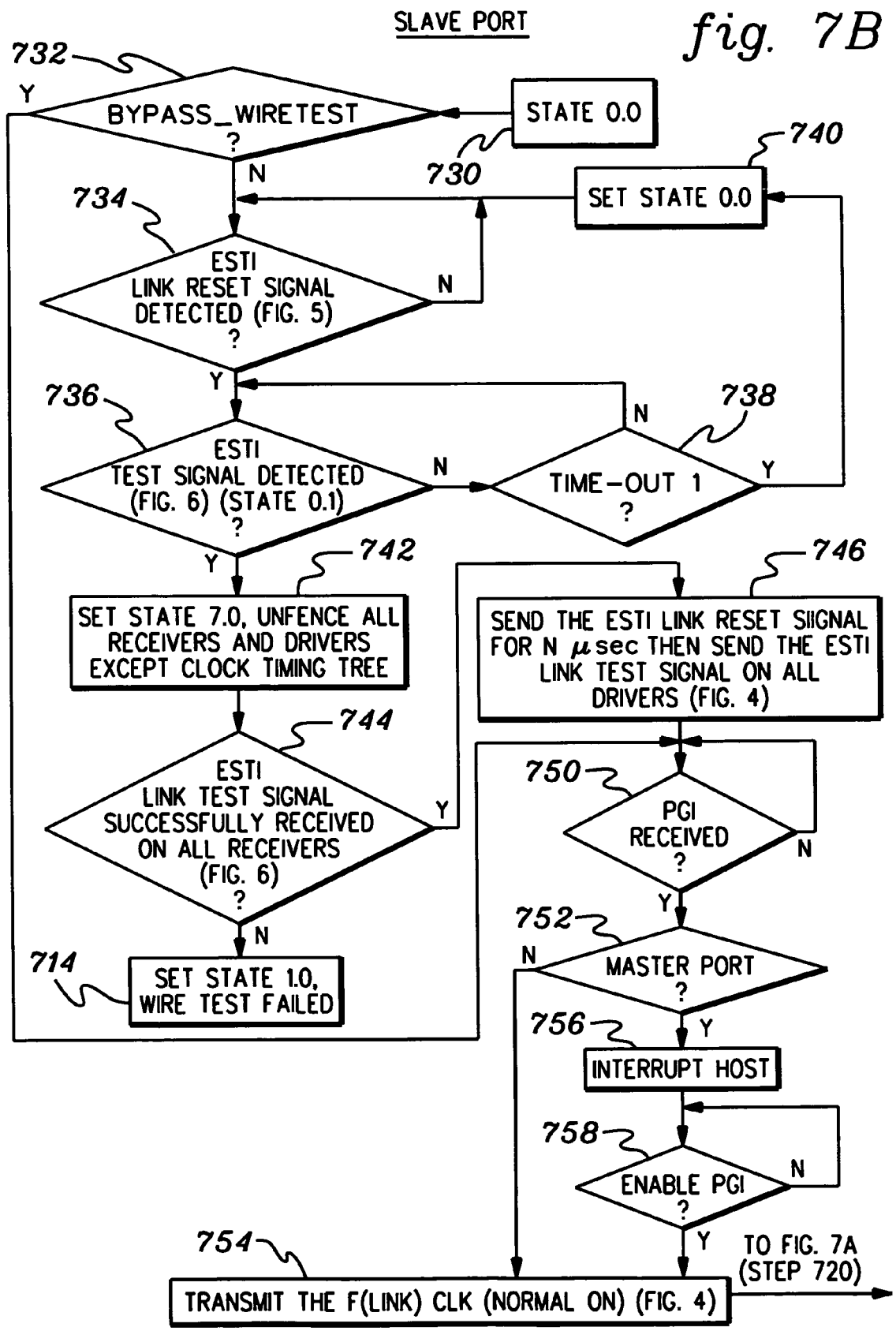

To enable an ESTI link, the Enable PGI signal is activated by the host application code via the master port. FIG. 8C shows that if the ESTI link is in state 0.0 or 0.1, which are steps 734, 736 in FIG. 7B, or error states 1.0, 2.0 or 3.0, and the Enable PGI signal is activated by the host application, then inquiry 700 of FIG. 7A is processed to determine whether to bypass wire test.

On the master port side (FIG. 7A), and assuming wire test is not bypassed (700), then processing:

1) Sets state 7.1, unfences receivers and drivers (except the clock timing tree) 702, and then transmits the ESTI Reset Signal for N microseconds 704.
2) Transmits the ESTI Link Test Signal 704 until an ESTI Reset Signal is received on the receive clock line in satisfaction of inquiry 706.

If the ESTI Reset Signal is not received within a period of time-out 2 708, then the ESTI Reset Signal is again transmitted for N microseconds. (Steps 1) and 2) above will continue to repeat until either an ESTI Reset Signal (FIG. 7A) is received or the Enable PGI latch is reset by the host application code (FIG. 9B)).

On the slave port side (FIG. 7B), the state is initially assumed to be 0.0 730, and processing first determines whether wire test is to be bypassed 732. If so, then processing proceeds to determine whether an operational signal (PGI signal) is being received 750. Assuming that wire test is to be performed, which is intended to comprise the normal initialization process, processing determines whether an ESTI Link Reset Signal is detected 734. If "no", then processing waits until the signal is detected. Once detected, processing:

1) Transitions to state 0.1 from state 0.0 as shown at inquiry 736 when the ESTI Reset signal is received.
2) Waits for the ESTI Link Test Signal and when received sets the state to 7.0.

If processing does not detect the ESTI Link Test Signal within a given period time-out 1 738, then the state is reset to 0.0 740.

If for any reason a master port is waiting at inquiry 736, and the Enable PGI latch goes from the inactive state to the active state, processing will return to 702, 704 as per FIG. 8C.

3) Enables the ESTI interface 742.
4) Inquiry 744 then tests for the All_Receivers_Good signal. If the All_Receivers_Good signal is active for the samples as per FIG. 6, then processing sets state 4.1 746.

If the All Receivers Good Signal did not pass the test, then link state 1.0 is set 714.

The link state machine remains hung here until either of the following:
A new ESTI Reset Signal is received as per FIG. 8B.
On a master port side, the Enable PGI latch is reset and then set again by the host application code as per FIG. 8C.
5) At step 746, processing sets state 4.1 and sends an N microseconds ESTI Reset Signal followed by the ESTI Link Test Signal.
6) This interface then waits for the PGI signal to be detected at inquiry 750.

At the master port side (FIG. 7A), which started the ESTI link initialization, the following occurs:
1) The master port is waiting at inquiry 706 for the ESTI Reset Signal and when the ESTI Reset Signal is received, inquiry 710 is processed.
2) At inquiry 710, state 7.2 is set. When the ESTI Link Test Signal is received, inquiry 712 is processed.
From inquiry 710 processing can also reset to link state 0.0 as shown in FIG. 9B.
3) At inquiry 712, the All_Receivers_Good signal is tested. If good, then the state is set to 4.0 716.
If the All_Receivers_Good signal does not pass the test, then link state 1.0 is set 714.
The link state machine remains hung here until either:
A new ESTI Link Reset Signal is received as per FIG. 8B.
On a master port, the Enable PGI latch is reset and then set again by the host application code as per FIG. 8C.
4) At step 716, state 4.0 is set and the F(link) gigahertz clock is transmitted.
5) The master port then waits for the PGI signal to be received back from the slave side 718.

Picking up the slave port (FIG. 7B) at inquiry 750, the following occurs:
1) The slave port detects the PGI signal 750.
2) Logic at step 752 tests to see if this is a master port acting as a slave port.
If the interface is a master port acting as a slave port, then the host is interrupted 756.
The port then waits for the host to set the Enable PGI latch 758.
When the Enable PGI latch is set, step 754 is processed.
If the interface is not a master port, then step 754 is processed directly from inquiry 752.
3) At step 754, the operational signal (F(link) gigahertz clock) is transmitted.
4) State 5.0 is set 720, enabling the clock timing tree and timing mode.

Back at the master port (FIG. 7A):
1) The master port detects the PGI signal from the slave side 718.
2) State 5.0 is set, enabling the clock timing tree and timing mode 720, 722.

Both the master and slave port are in timing mode 722 and can complete timing mode in the same way as prior STI links.

Figure 8A:
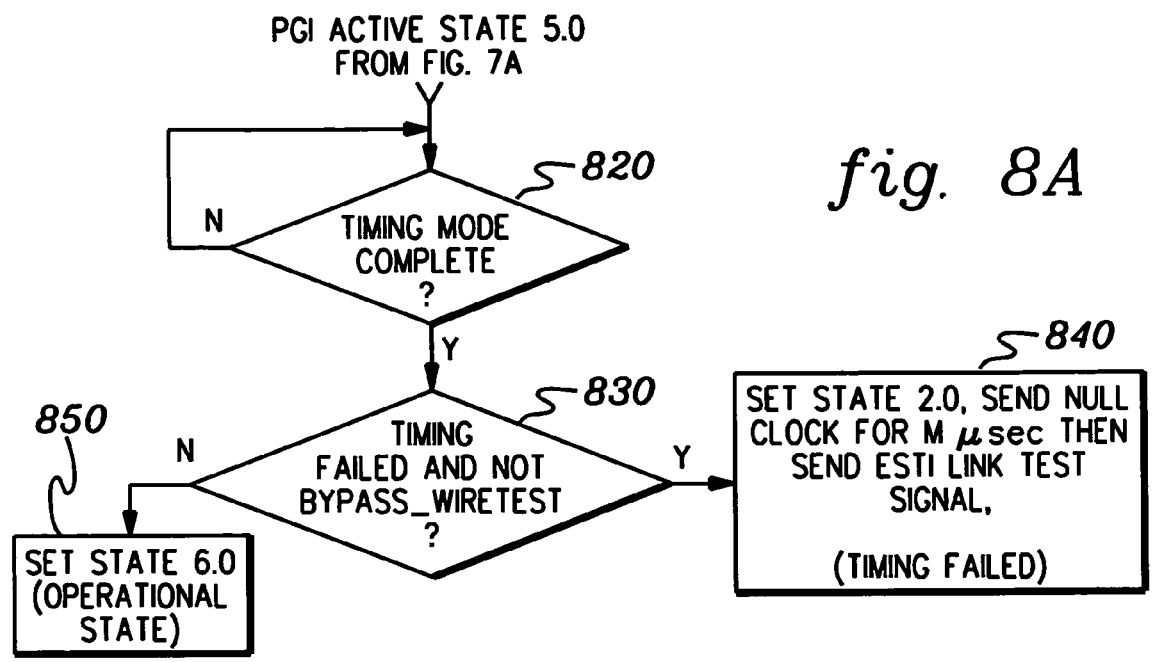
FIG. 8A is a flowchart of one embodiment for confirming timing alignment, in accordance with an aspect of the present invention.

FIG. 8A completes the processing flow for ESTI link initialization. Within FIG. 8A, processing initially determines whether the timing mode has been completed 820. Again, the timing evaluation can be performed as with prior STI links (i.e., is known in the art). Once complete, processing determines whether the timing has failed and there has not been a bypassing of wire test 830. If so, then the state is set to 2.0, a null clock is sent for M microseconds, and the ESTI link test signal is sent to bring down the link 840. Assuming that timing has passed, then processing sets the link state to 6.0, i.e., the operational state 850.

Figure 8B:
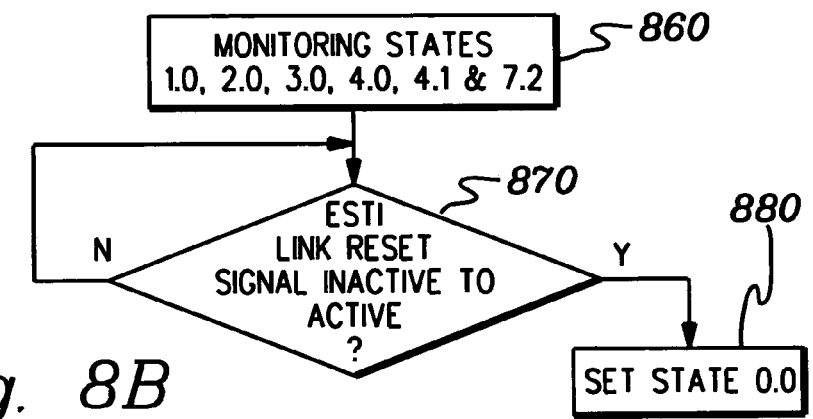
FIG. 8B is a flowchart of one process embodiment of monitoring for a link reset signal, in accordance with an aspect of the present invention.
Figure 8C:
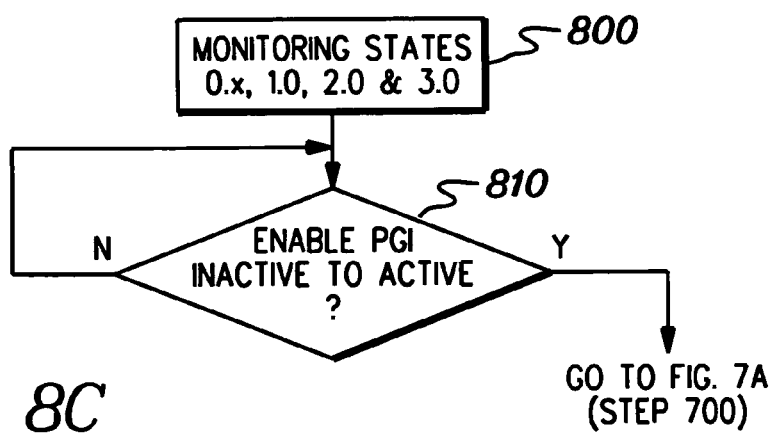
FIG. 8C is a flowchart of one process embodiment of monitoring for receipt of a link enablement signal to initiate the initialization process of FIGS. 7A & 7B, in accordance with an aspect of the present invention.

FIG. 8B shows a process of monitoring for the Link Reset Signal when the link is in states 1.0, 2.0, 3.0 and 4.0 860. For state 7.2, the Link Reset Signal has to be detected going from the inactive state to the active state. If the Link Reset Signal is detected 870, the link is reset to state 0.0 880. The link state will then go to state 0.1 waiting for the ESTI Link Test Signal.

As noted above, FIG. 8C shows a process for monitoring link state 0.x or error states 1.0, 2.0 or 3.0 800, looking for when the Enable PGI signal transitions from the inactive state to the active state 810. In this case, the ESTI state machine will be set to state 7.1 (FIG. 7A at step 702).

Figure 9A:
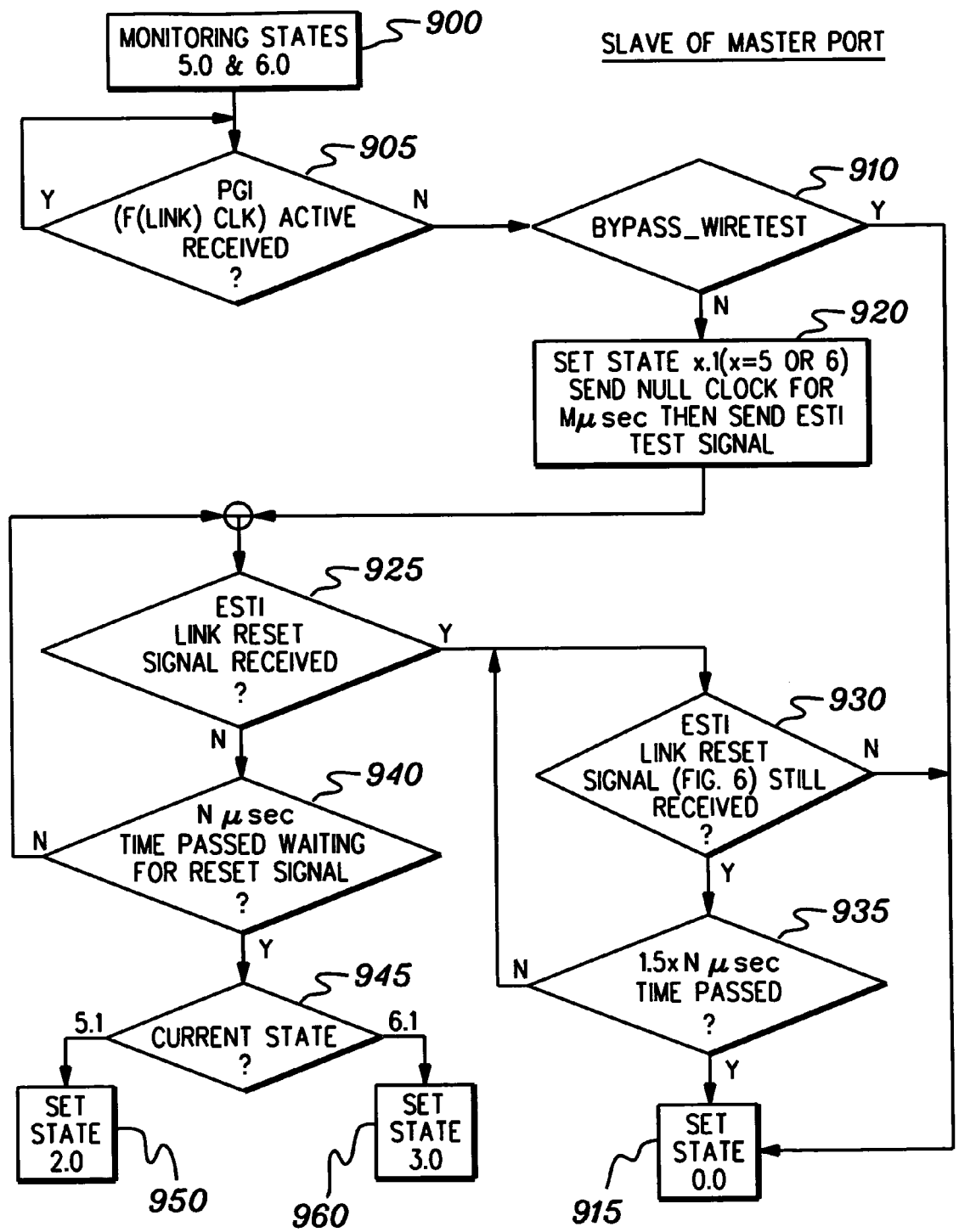
FIG. 9A is a flowchart of one process embodiment of monitoring for link failure at the nodes of a bidirectional, self-timed parallel interface, in accordance with an aspect of the present invention.
Figure 9B:
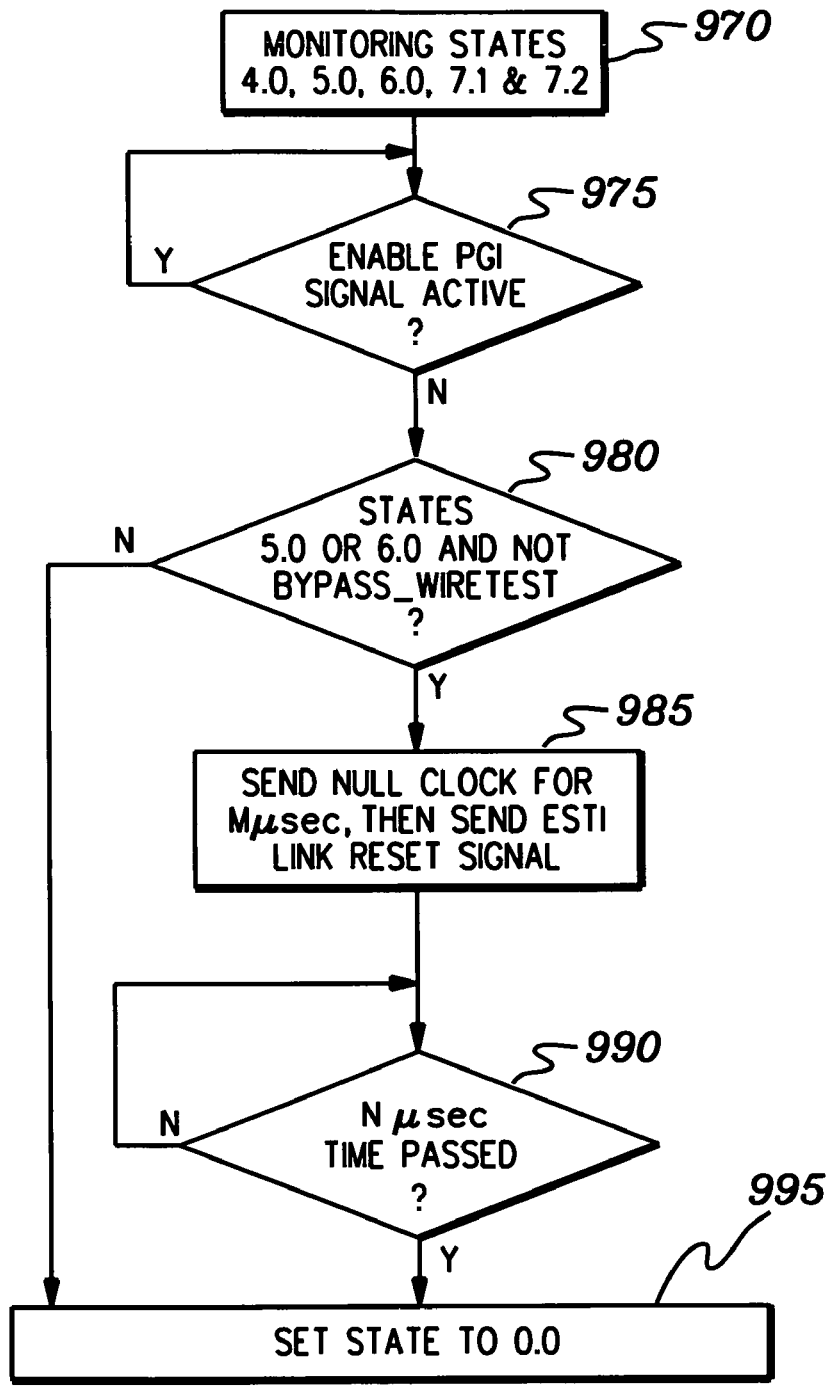
FIG. 9B is a flowchart of one process embodiment for directing shutdown of a bidirectional, self-timed parallel interface from a master node of the parallel interface, in accordance with an aspect of the present invention.

FIGS. 9A & 9B show processing flows for the deactivation of an ESTI link using the ESTI Link Reset Signal.

Beginning with FIG. 9A, processing monitors the link states 5.0 & 6.0 900 and determines whether an active PGI (F (link) clock) signal continues to be received 905. Should the PGI signal disappear, and assuming that wire test is not bypassed 910, then the receiving port deactivates its outgoing PGI (F (link) gigahertz clock) signal by switching off the output clock signal for M microseconds, synchronous to its T(link) ns clock. After this time, the ESTI Link Test Signal is transmitted until link state reaches 0.0 920. Note that the master port that is deactivating the ESTI link sends the ESTI Link Reset Signal, while the port that is responding to the deactivation sends the ESTI Link Test Signal.

The logic in FIG. 5 that detects PGI (F (link) clock), will detect that PGI disappears in 5•2•T (link) or less time. However, the reset signal will not be detected for a few microseconds at least. Thus, processing looks to determine whether the link reset signal is received 925 and waits for time N microseconds to pass 940. If the ESTI Link Reset Signal does not appear within N microseconds after PGI disappeared, the link state is set to state 2.0 950 if the current state of the link is 5.1. Otherwise, the link state is set to 3.0 960 if the current state of the link is 6.1. The ESTI Link Test Signal will continue to be transmitted by this link until reset per the process of FIG. 8B or 8C. If the reset signal is detected, then from inquiry 925, the link is reset to state 0.0 915 after the reset signal disappears 930 or after 1.5•N microseconds of time has passed 935. Both sides of the ESTI link will then be fenced.

FIG. 9B outlines processing for the master port only. This processing monitors the link state in 4.0, 5.0, 6.0, 7.1 & 7.2 970 and determines whether the enable PGI signal on a master port transitions from the active to the inactive state 975. If so, and the link is in states 7.1 or 7.2, then the link state is reset to 0.0 per inquiry 980 and step 995 when the enable PGI signal is deactivated. If the link state is 5.0 or 6.0, then the output clock signal is switched off for M microseconds synchronous to the T(link) ns clock. The F (link)/5 ESTI Link Reset Signal is then transmitted 985 until N microseconds have passed 990, after which the link state is set to 0.0 995, thereby fencing the link.

The following table shows what the problem might be, if the ESTI link fails to initialize.

| SLAVE STATE | MASTER STATE | FAILING SIGNAL OR SIGNALS |
|---|---|---|
| 0.0 | 7.0 | SLAVE FAILED TO SEE THE ESTI RESET SIGNAL OR THE ESTI TEST SIGNAL |

-continued

| SLAVE STATE | MASTER STATE | FAILING SIGNAL OR SIGNALS |
|---|---|---|
| 4.0 | 7.0 | MASTER FAILED TO SEE THE ESTI RESET SIGNAL OR THE ESTI TEST SIGNAL |
| 1.0 | 7.0 | SLAVE FAILED THE WIRE TEST |
| 4.0 | 1.0 | MASTER FAILED THE WIRE TEST |
| 4.0. | 4.0 | SLAVE FAILED TO SEE THE F(link) GIGAHERTZ CLOCK |
| 2.0 OR 5.0 | 4.0 | MASTER FAILED TO SEE THE flink GIGAHERTZ CLOCK |
| 5.0 | 5.0 | HUNG IN TIMING MODE (THIS SHOULD BE PREVENTED BY HAVING THE TIMING MODE STATE MACHINE TIME ITSELF OUT AND GO TO STATE 2.0.) |
| 2.0 | 2.0 | TIMING FAILED |
| 3.0 | 3.0 | OPERATIONAL STATE FAILED |

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of initializing a bidirectional, self-timed parallel interface, the self-timed parallel interface including a first node and a second node connected by a parallel data and clock bus comprising multiple AC differential wire pairs, the method comprising:
   responsive to a link reset signal of a first frequency, automatically simultaneously testing a plurality of wire pairs of multiple AC differential wire pairs for conductivity failure, the multiple AC differential wire pairs connecting a first node and a second node of a bidirectional, self-timed parallel interface; and
   wherein the automatically testing comprises employing a link test signal of a single second frequency to simultaneously test the plurality of wire pairs of the multiple AC differential wire pairs, the single second frequency being a lower frequency than a third frequency comprising an operational signal frequency of the self-timed parallel interface, and wherein the first frequency and the single second frequency also comprise different frequencies.

2. The method of claim 1, wherein the first node functions as a master node for initialization, and the second node functions as a slave node, the master node including first transmit circuitry and first receive circuitry, and the slave node including second receive circuitry and second transmit circuitry, the first transmit circuitry being connected to the second receive circuitry via a first plurality of AC differential wire pairs of the multiple AC differential wire pairs, and the second transmit circuitry being connected to the first receive circuitry via a second plurality of AC differential wire pairs of the multiple AC differential wire pairs, and wherein the method further comprises:
   transmitting the link reset signal of the first frequency from the master node to the slave node, followed by transmitting the link test signal of the second frequency from the master node to the slave node;
   employing the link test signal of the second frequency at the second receive circuitry of the slave node to test the first plurality of AC differential wire pairs for conductivity failure;
   upon successfully testing the first plurality of AC differential wire pairs, sending the link test signal of the second frequency from the slave node to the master node;
   responsive to receipt of the link test signal at the master node, testing the second plurality of AC differential pairs for conductivity failure; and
   initiating normal operation of the self-timed parallel interface if neither testing at the slave node of the first plurality of AC differential wire pairs or at the master node of the second plurality of AC differential wire pairs uncovers a conductivity failure, otherwise indicating a wire test failure and stopping initialization of the self-timed parallel interface.

3. The method of claim 2, wherein the initiating normal operation comprises transmitting an operational signal of the third frequency from the master node to the slave node, detecting receipt of the operational signal at the slave node, and transmitting an operational signal of the third frequency from the slave node to the master node in response thereto.

4. The method of claim 3, wherein the initiating normal operation further comprises establishing a timing sequence for the bidirectional, self-timed parallel interface, and upon establishing the timing sequence, entering operational state of the bidirectional, self-timed parallel interface.

5. The method of claim 3, further comprising monitoring receipt of the operational signal of the third frequency from the master node to the slave node and monitoring receipt of the operational signal of the third frequency from the slave node to the master node, and if either operational signal becomes inactive, initiating shutdown of the bidirectional, self-timed parallel interface, said shutdown comprising:
   sending from one node noting a failure to receive the operational signal a null clock signal to the other node, followed by the link test signal of the second frequency;
   monitoring at said one node for receipt of the link reset signal of the second frequency from the other node, and if received, setting the bidirectional, self-timed parallel interface to a fenced state; and
   waiting a period of time for the link reset signal of the second frequency from the other node, and if not received, thereafter determining whether the bidirectional, self-timed parallel interface was in an establish timing state or an operational state when the absence of the operational signal of the third frequency was noted, and if in the timing state, the method comprises setting the bidirectional, self-timed parallel interface to a timing failed state, and if in an operational state, the method comprises setting the bidirectional, self-timed parallel interface to an operational failed state.

6. The method of claim 2, further comprising terminating initialization of the bidirectional, self-timed parallel interface if testing of the first plurality of AC differential wire pairs at the slave node fails, or if testing of the second plurality of AC differential wire pairs at the master node fails, said terminating including placing the bidirectional, self-timed parallel interface in a wire test failed state.

7. The method of claim 2, further comprising providing analog detection circuitry at the first receive circuitry and the second receive circuitry for detecting the link reset signal of the first frequency, the link test signal of the second frequency, and the operational signal of the third frequency.

8. The method of claim 7, wherein the analog detection circuitry of the first receive circuitry and the second receive circuitry further comprises logic to count a number of received link test signals of the second frequency and to determine whether for each link test signal of the second frequency whether testing of the first plurality or second plurality of AC differential wire pairs was successful.

9. The method of claim 1, wherein the first frequency of the link reset signal is a lower frequency than the third, operational signal frequency, and wherein the second frequency of the link test signal is a lower frequency than the first frequency of the link reset signal.

10. A system for initializing a bidirectional, self-timed parallel interface, the self-timed parallel interface including a first node and a second node connected by a parallel data and clock bus comprising multiple AC differential wire pairs, the system comprising:

means for automatically simultaneously testing a plurality of wire pairs of multiple AC differential wire pairs for conductivity failure, the means for automatically testing being responsive to a link reset signal of a first frequency, the multiple AC differential wire pairs connecting a first node and a second node of a bidirectional, self-timed parallel interface; and wherein the means for automatically testing comprises means for employing a link test signal of a single second frequency to simultaneously test the plurality of wire pairs of the multiple AC differential wire pairs, the single second frequency being a lower frequency than a third frequency comprising an operational signal frequency of the self-timed parallel interface, and wherein the first frequency and the single second frequency also comprise different frequencies.

11. The system of claim 10, wherein the first node functions as a master node for initialization, and the second node functions as a slave node, the master node including first transmit circuitry and first receive circuitry, and the slave node including second receive circuitry and second transmit circuitry, the first transmit circuitry being connected to the second receive circuitry via a first plurality of AC differential wire pairs of the multiple AC differential wire pairs, and the second transmit circuitry being connected to the first receive circuitry via a second plurality of AC differential wire pairs of the multiple AC differential wire pairs, and wherein the system further comprises:

means for transmitting the link reset signal of the first frequency from the master node to the slave node, followed by means for transmitting the link test signal of the second frequency from the master node to the slave node;

means for employing the link test signal of the second frequency at the second receive circuitry of the slave node to test the first plurality of AC differential wire pairs for conductivity failure;

upon successfully testing the first plurality of AC differential wire pairs, means for sending the link test signal of the second frequency from the slave node to the master node;

responsive to receipt of the link test signal at the master node, means for testing the second plurality of AC differential pairs for conductivity failure; and means for initiating normal operation of the self-timed parallel interface if neither testing at the slave node of the first plurality of AC differential wire pairs or at the master node of the second plurality of AC differential wire pairs uncovers a conductivity failure, otherwise for indicating a wire test failure and stopping initialization of the self-timed parallel interface.

12. The system of claim 11, wherein the means for initiating normal operation comprises means for transmitting an operational signal of the third frequency from the master node to the slave node, means for detecting receipt of the operational signal at the slave node, and means for transmitting an operational signal of the third frequency from the slave node to the master node in response thereto.

13. The system of claim 12, wherein the means for initiating normal operation further comprises means for establishing a timing sequence for the bidirectional, self-timed parallel interface, and upon establishing the timing sequence, means for entering operational state of the bidirectional, self-timed parallel interface.

14. The system of claim 12, further comprising means for monitoring receipt of the operational signal of the third frequency from the master node to the slave node and means for monitoring receipt of the operational signal of the third frequency from the slave node to the master node, and if either operational signal becomes inactive, means for shutting down the bidirectional, self-timed parallel interface, said means for shutting down comprising:

means for sending from one node noting a failure to receive the operational signal a null clock signal to the other node, followed by the link test signal of the second frequency;

means for monitoring at said one node for receipt of the link reset signal of the second frequency from the other node, and if received, for setting the bidirectional, self-timed parallel interface to a fenced state; and means for waiting a period of time for the link reset signal of the second frequency from the other node, and if not received, thereafter for determining whether the bidirectional, self-timed parallel interface was in an establish timing state or an operational state when the absence of the operational signal of the third frequency was noted, and if in the timing state, the system comprises means for setting the bidirectional, self-timed parallel interface to a timing failed state, and if in an operational state, the system comprises means for setting the bidirectional, self-timed parallel interface to an operational failed state.

15. The system of claim 11, further comprising means for terminating initialization of the bidirectional, self-timed parallel interface if testing of the first plurality of AC differential wire pairs at the slave node fails, or if testing of the second plurality AC differential wire pairs at the master node fails, said means for terminating including means for placing the bidirectional, self-timed parallel interface in a wire test failed state.

16. The system of claim 11, further comprising means for providing analog detection circuitry at the first receive circuitry and the second receive circuitry for detecting the link reset signal of the first frequency, the link test signal of the second frequency, and the operational signal of the third frequency.

17. The system of claim 16, wherein the analog detection circuitry of the first receive circuitry and the second receive circuitry further comprises logic to count a number of received link test signals of the second frequency and to determine whether for each link test signal of the second frequency whether testing of the first plurality or second plurality of AC differential wire pairs was successful.

18. The system of claim 10, wherein the first frequency of the link reset signal is a lower frequency than the third, operational signal frequency, and wherein the second frequency of the link test signal is a lower frequency than the first frequency of the link reset signal.

19. A bidirectional, self-timed parallel interface comprising:
a first node and a second node;
a parallel data and clock bus connecting the first node and the second node, the parallel data and clock bus comprising multiple AC differential wire pairs; and
initialization circuitry for initializing the bidirectional, self-timed parallel interface, the initialization circuitry including circuitry for:
automatically simultaneously testing a plurality of wire pairs of the multiple AC differential wire pairs for conductivity failure, the automatically testing being responsive to a link reset signal of a first frequency; and
wherein the automatically testing comprises employing a link test signal of a single second frequency to simultaneously test the plurality of wire pairs of the AC differential wire pairs, the single second frequency being a lower frequency than a third frequency comprising an operational signal frequency of the self-timed parallel interface, and wherein the first frequency and the single second frequency also comprise different frequencies.

20. At least one program storage device readable by a machine, tangibly embodying at least one program of instructions executable by the machine to perform a method of initializing a bidirectional, self-timed parallel interface, the self-timed parallel interface including a first node and a second node connected by a parallel data and clock bus comprising multiple AC differential wire pairs, the method comprising:
responsive to a link reset signal of a first frequency, automatically simultaneously testing a plurality of wire pairs of multiple AC differential wire pairs for conductivity failure, the multiple AC differential wire pairs connecting a first node and a second node of a bidirectional, self-timed parallel interface; and
wherein the automatically testing comprises employing a link test signal of a single second frequency to simultaneously test the plurality of wire pairs of the multiple AC differential wire pairs, the single second frequency being a lower frequency than a third frequency comprising an operational signal frequency of the self-timed parallel interface, and wherein the first frequency and the single second frequency also comprise different frequencies.

21. The at least one program storage device of claim 20, wherein the first node functions as a master node for initialization, and the second node functions as a slave node, the master node including first transmit circuitry and first receive circuitry, and the slave node including second receive circuitry and second transmit circuitry, the first transmit circuitry being connected to the second receive circuitry via a first plurality of AC differential wire pairs of the multiple AC differential wire pairs, and the second transmit circuitry being connected to the first receive circuitry via a second plurality of AC differential wire pairs of the multiple AC differential wire pairs, and wherein the method further comprises:
transmitting the link reset signal of the first frequency from the master node to the slave node, followed by transmitting the link test signal of the second frequency from the master node to the slave node;
employing the link test signal of the second frequency at the second receive circuitry of the slave node to test the first plurality of AC differential wire pairs for conductivity failure;
upon successfully testing the first plurality of AC differential wire pairs, sending the link test signal of the second frequency from the slave node to the master node;
responsive to receipt of the link test signal at the master node, testing the second plurality of AC differential pairs for conductivity failure; and
initiating normal operation of the self-timed parallel interface if neither testing at the slave node of the first plurality of AC differential wire pairs or at the master node of the second plurality of AC differential wire pairs uncovers a conductivity failure, otherwise indicating a wire test failure and stopping initialization of the self-timed parallel interface.

22. The at least one program storage device of claim 21, wherein the initiating normal operation comprises transmitting an operational signal of the third frequency from the master node to the slave node, detecting receipt of the operational signal at the slave node, and transmitting an operational signal of the third frequency from the slave node to the master node in response thereto.

23. The at least one program storage device of claim 22, wherein the initiating normal operation further comprises establishing a timing sequence for the bidirectional, self-timed parallel interface, and upon establishing the timing sequence, entering operational state of the bidirectional, self-timed parallel interface.

24. The at least one program storage device of claim 22, further comprising monitoring receipt of the operational signal of the third frequency from the master node to the slave node and monitoring receipt of the operational signal of the third frequency from the slave node to the master node, and if either operational signal becomes inactive, initiating shutdown of the bidirectional, self-timed parallel interface, said shutdown comprising:
sending from one node noting a failure to receive the operational signal a null clock signal to the other node, followed by the link test signal of the second frequency;
monitoring at said one node for receipt of the link reset signal of the second frequency from the other node, and if received, setting the bidirectional, self-timed parallel interface to a fenced state; and
waiting a period of time for the link reset signal of the second frequency from the other node, and if not received, thereafter determining whether the bidirectional, self-timed parallel interface was in an establish timing state or an operational state when the absence of the operational signal of the third frequency was noted, and if in the timing state, the method comprises setting the bidirectional, self-timed parallel interface to a timing failed state, and if in an operational state, the method comprises setting the bidirectional, self-timed parallel interface to an operational failed state.

25. The at least one program storage device of claim 21, further comprising terminating initialization of the bidirectional, self-timed parallel interface if testing of the first plurality of AC differential wire pairs at the slave node fails, or if testing of the second plurality of AC differential wire pairs at the master node fails, said terminating including placing the bidirectional, self-timed parallel interface in a wire test failed state.

26. The at least one program storage device of claim 21, further comprising providing analog detection circuitry at the first receive circuitry and the second receive circuitry for detecting the link reset signal of the first frequency, the link test signal of the second frequency, and the operational signal of the third frequency.

27. The at least one program storage device of claim 26, wherein the analog detection circuitry of the first receive circuitry and the second receive circuitry further comprises logic to count a number of received link test signals of the second frequency and to determine whether for each link test signal of the second frequency whether testing of the first plurality or second plurality of AC differential wire pairs was successful.

28. The at least one program storage device of claim 20, wherein the first frequency of the link reset signal is a lower frequency than the third, operational signal frequency, and wherein the second frequency of the link test signal is a lower frequency than the first frequency of the link reset signal.

* * * * *

UNITED STATES PATENT AND TRADEMARK OFFICE
CERTIFICATE OF CORRECTION

PATENT NO.    : 6,984,991 B2
DATED         : January 10, 2006
INVENTOR(S)   : Bond et al.

It is certified that error appears in the above-identified patent and that said Letters Patent is hereby corrected as shown below:

Column 6,
Lines 45 and 46, delete "5•(link)" and insert -- 5•T(link) --.

Signed and Sealed this

Second Day of May, 2006

JON W. DUDAS
*Director of the United States Patent and Trademark Office*